United States Patent [19]

Countryman, Jr.

[11] Patent Number: 4,532,611

[45] Date of Patent: Jul. 30, 1985

[54] REDUNDANT MEMORY CIRCUIT

[75] Inventor: Roger S. Countryman, Jr., Austin, Tex.

[73] Assignee: Motorola, Inc., Schaumburg, Ill.

[21] Appl. No.: 438,081

[22] Filed: Nov. 1, 1982

[51] Int. Cl.$^3$ .............................................. G11C 13/00
[52] U.S. Cl. ................................................... 365/200
[58] Field of Search ...................... 365/200, 210, 230;
307/238.3; 371/10

[56] References Cited

U.S. PATENT DOCUMENTS 4,228,528 10/1980 Cenker et al. ...................... 365/200
4,250,570 2/1981 Tsang et al. ......................... 365/200

Primary Examiner—Joseph A. Popek
Attorney, Agent, or Firm—Anthony J. Sarli, Jr.; Jeffrey Van Myers; James L. Clingan, Jr.

[57] ABSTRACT

A circuit is provided in MOS technology which replaces a defective row of memory cells with a redundant row of memory cells in response to the address of the defective row and an implementation signal. The defective row is disabled by a floating gate fusible link which responds to the output of the decoder of the defective row as driven by the address thereof and to the implementation signal. The redundant row is implemented by floating gate fusible links which disable the inputs of the decoder of the redundant row which correspond to complements of the address in response to the address and the implementation signal. The implemented redundant row then receives address signals without any additional propagation delays.

6 Claims, 8 Drawing Figures

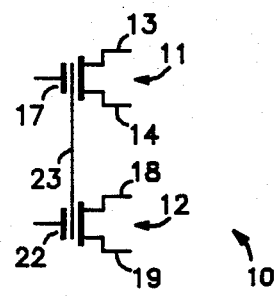
*FIG. 3*
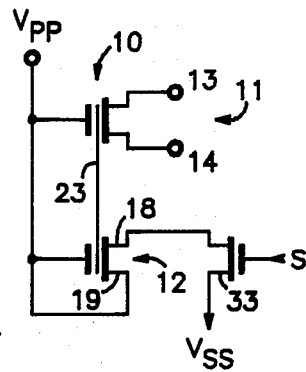
*FIG. 4*
*FIG. 5*
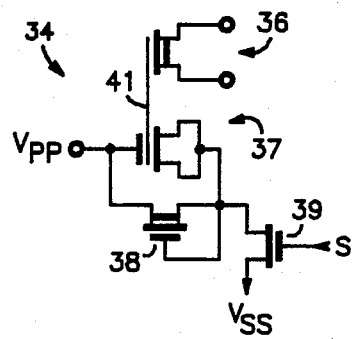
*FIG. 6*
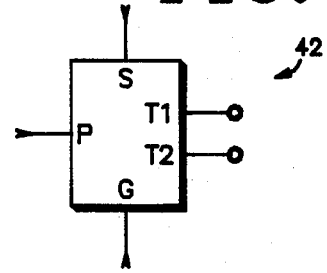
*FIG. 7*
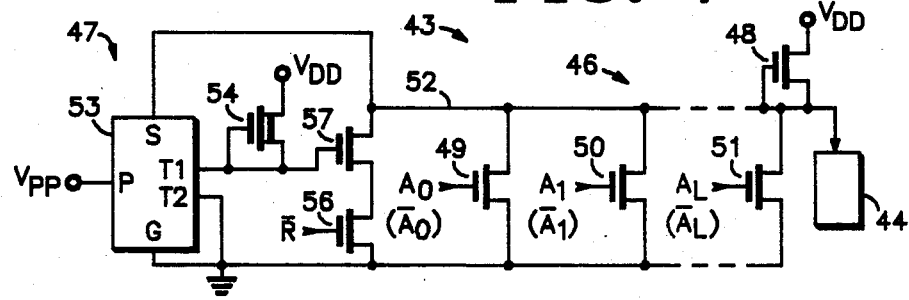
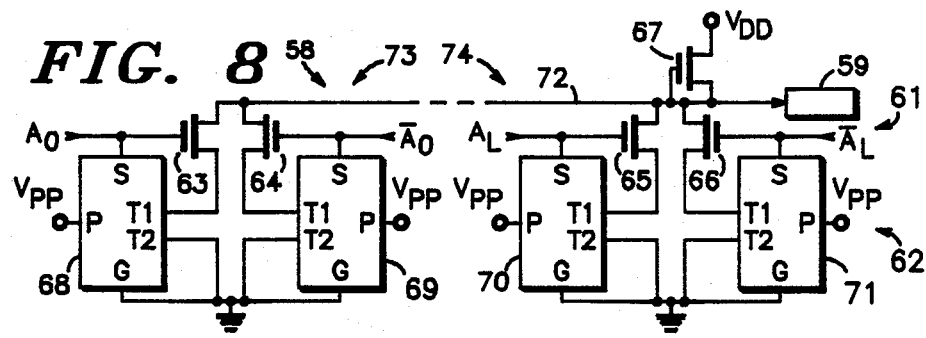
*FIG. 8*

REDUNDANT MEMORY CIRCUIT

CROSS-REFERENCE TO RELATED APPLICATIONS

Related subject matter is disclosed in U.S. patent application No. 431,935, entitled "Common Floating Gate Programmable Link" filed Sept. 30, 1982, and assigned to the assignee hereof.

BACKGROUND OF THE INVENTION

This invention relates to memories with redundant lines of memory cells, and more particularly to MOS circuits for implementing the replacement of a defective line of memory cells with a redundant line of memory cells.

With the discovery that yield in the manufacture of memories can be enhanced by the use of redundant lines of memory cells, several techniques have been developed for replacing a defective line of memory cells with a redundant line of memory cells. One technique uses a laser to open circuits which will result in such a replacement. One advantage of the laser technique is that very little additional circuitry is required. Another advantage is that there are no additional propagation delays between the address inputs and the decoder which enables the line of memory cells which is selected by a particular address. Disadvantages of the laser technique include a large capital expense for the equipment and a separate alignment for each circuit that must be opened. Fusible links which provide an open or closed circuit in response to an electrical signal are also available. The fusible link can be, for example, a polysilicon fuse or a floating gate transistor. Polysilicon fuses are particularly useful in bipolar technology because of the availability of relatively high current. Enough current to open a polysilicon fuse is easily carried by a bipolar device without requiring more than the power supply voltage. For insulated gate field effect transistor (IGFET) technology, commonly known as MOS technology, polysilicon fuses require a special high voltage during the probe stage to generate sufficient current. In addition the current carrying transistors must be made to be very large in order to carry the required current even when driven at the high voltage. The floating gate technique does require a special high voltage during the probe stage, but does not require the large amount of current which is required to open a polysilicon fuse. Although techniques exist for erasing floating gate transistors which have been programmed, such erasing techniques are not particularly relevant to redundancy techniques. The floating gate as used is thus analogous to a fuse in that prior to being programmed it provides a current path but after being programmed it provides only an open circuit. The primary advantage of the fusible link technique is that minimal additional capital expense is required. One disadvantage is that additional circuitry for implementing the replacement is required. Another disadvantage, in MOS technology, is that there is some additional circuitry between the address inputs and the decoder for steering or comparing or for some other purpose relating to implementing replacement of a defective line of memory cells. Such additional circuitry adds one or more propagation delays which slow down access time of the memory. U.S. Pat. No. 4,250,570, Tsang et al, does disclose a bipolar circuit applicable to bipolar decoders which avoids this additional circuitry and consequent propagation delays.

Another disadvantage of fusible link techniques is that replacement of a defective line of cells with a redundant line of cells requires separate steps for the various fusible links. Even U.S. Pat. No. 4,250,570 suggests that each polysilicon fuse to be opened should be opened in a separate step because of the large current requirements.

SUMMARY OF THE INVENTION

An object of this invention is to provide an improved circuit for replacing a defective line of memory cells with a redundant line of memory cells.

Another object of the invention is to provide an MOS circuit using fusible links for replacing a defective line of memory cells with a redundant line of memory cells without introducing any additional propagation delays between external address pins and a decoder for the redundant line of memory cells.

Yet another object of the invention is to provide an MOS circuit which replaces a defective line of memory cells with a redundant line of memory cells in response to an address and a single application of an implementation signal.

These and other objects of the invention are achieved in a circuit for replacing a defective line of memory cells with a redundant line of memory cells which has a first NOR decoder comprised of IGFETs for providing an enable signal to the defective row in response to a predetermined address. A disabling circuit coupled to the first NOR decoder disables the first NOR decoder in response to the first NOR decoder receiving the predetermined address and the disabling circuit receiving an implementation signal. A second NOR decoder is comprised of IGFETs having inputs for true and complementary address signals. A plurality of fusible links coupled to the second NOR decoder disable all of the inputs which are complementary to the predetermined address in response to receiving the predetermined address and the implementation signal. The second NOR decoder then provides an output signal to the redundant line of storage cells in response to receiving the predetermined address.

BRIEF DESCRIPTION OF THE DRAWINGS

FIG. 3 is a circuit representation of the device of FIG. 1;

FIG. 4 is a circuit diagram for selectably programming the device of FIG. 1;

FIG. 5 is a circuit diagram of another selectably fusible link;

FIG. 6 is a fusible link useful in the preferred embodiment and illustrated in simplified form;

FIG. 7 is a diagram of a circuit for disabling a defective line of memory cells according to the preferred embodiment of the invention; and FIG. 8 is a diagram of a circuit for implementing a redundant line of memory cells according to the preferred embodiment of the invention.

DETAILED DESCRIPTION OF A PREFERRED EMBODIMENT

Figure 1:
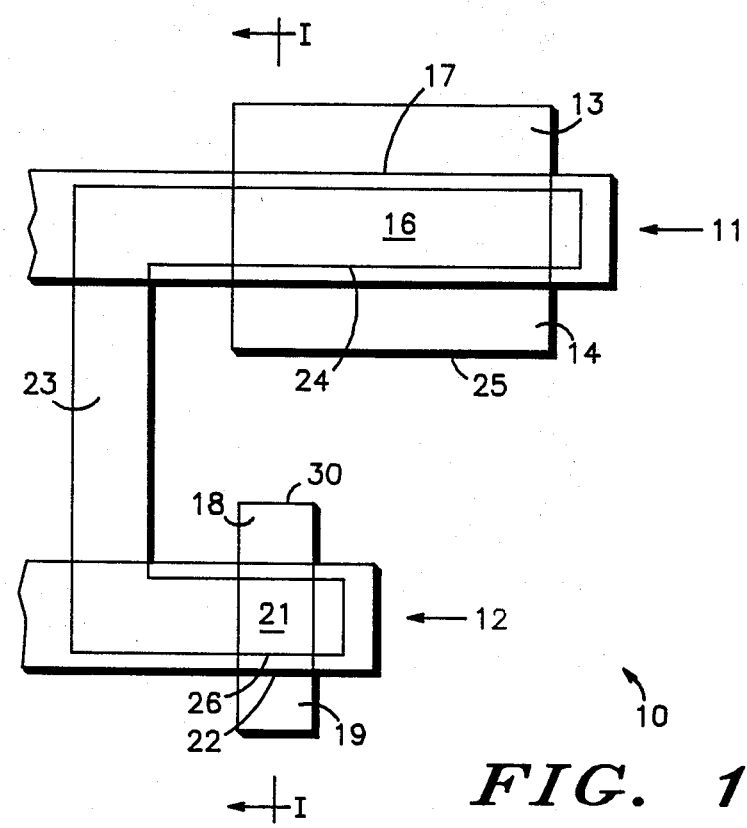
FIG. 1 is a layout of a programmable link device useful for forming a fusible link used in a preferred embodiment of the invention.
Figure 2:
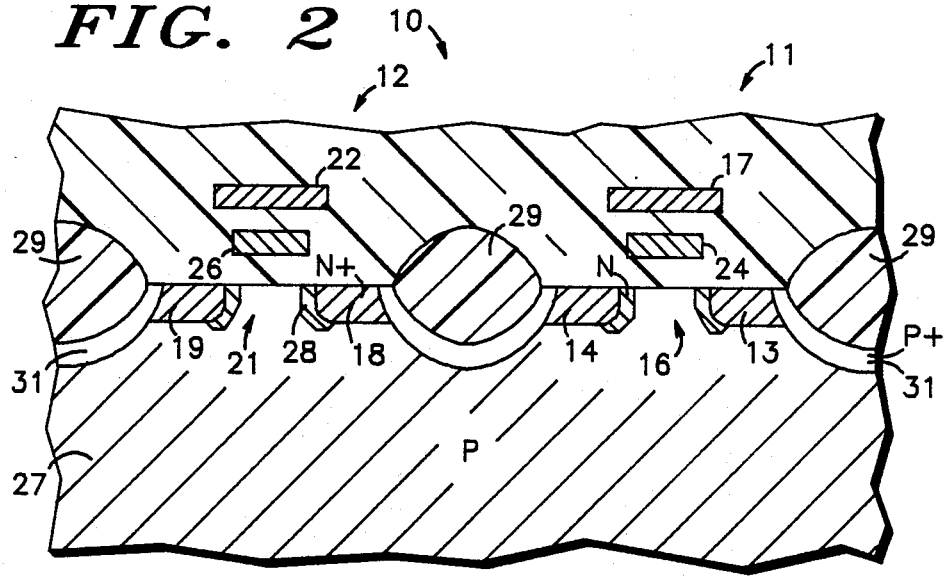
FIG. 2 is a cross section of the device of FIG. 1.

A description of FIGS. 1-5, as follows, is to enable one of ordinary skill in the art to make and use a fusible link 42 as shown in FIG. 6 which is useful for implementing a preferred embodiment of the invention as shown in FIG. 7 and FIG. 8. Shown in FIG. 1 is a layout of a programmable link 10. The same link 10 is shown in FIG. 3 in circuit diagram form. A cross-section of link 10 taken at I—I of FIG. 1 is shown in FIG. 2. The same reference numerals are used for the same elements. Link 10 is comprised generally of a link transistor 11 and a programming transistor 12. Transistor 11 has a drain region 13, a source region 14, a channel region 16, and a control gate 17. Transistor 12 has a source region 18, a drain region 19, a channel region 21, and a control gate 22. A floating gate 23 has a first portion 24 interposed between channel region 16 and control gate 17 and a second portion 26 interposed between channel region 21 and control gate 22. In a conventional double polysilicon process, floating gate 23 is a first layer of polysilicon insulated from channels 21 and 16 by oxide. Control gates 22 and 17 are formed as part of a second layer of polysilicon and insulated from floating gate 23 by oxide.

FIG. 2 shows that source and drain regions 13, 14, 18 and 19 are formed in a face of a substrate 27 of semiconductor material, typically silicon. Substrate 27 is of P conductivity type with source and drain regions 13, 14, 18 and 19 formed to be N+ by any conventional means. Portions of drain and source regions 13 and 14 and source and drain regions 18 and 19 nearest to channel regions 16 and 21, respectively, are formed to be N in a typical process. A portion 28 of source region 18 is typical. Drain, source, and channel regions 13, 14 and 16 of transistor 11 are formed in an active region 25. Source, drain, and channel regions 18, 19 and 21 of transistor 12 are formed in an active region 30. Active regions 25 and 30 are surrounded by a field oxide 29. Underlying field oxide 29 is a channel stop region 31 formed to be P+. For programming, transistor 12 is used to selectively provide hot electrons for collection by floating gate 23 to program link transistor 11 by adjusting a threshold voltage thereof. In normal operation of the memory, control gate 17 is held at a positive voltage, for example 5 volts, which exceeds the unprogrammed threshold voltage of transistor 11 which is typically approximately 1.0 volt. In which case transistor 11 is turned on to provide a conductive path between drain 13 and source 14. The 5.0 volts applied during normal operation is applied through a conventional load transistor to control gate 17. To program link transistor 11, current is induced between source 18 and drain 19 of transistor 12 while driving control gates 17 and 22 to a high voltage, for example 15 volts, to pull hot electrons to floating gate 23. The high voltage for programming is applied at $V_{PP}$ during a probe stage. This raises the threshold voltage of transistor 11 well above 5 volts so that transistor 11 is turned off during normal operation of the memory when the 5.0 volts is applied to control gate 17. With transistor 11 turned off, there is no longer a current path from drain 13 to source 14 during normal operation. Instead there is effectively an open circuit between drain 13 and source 14.

Shown in FIG. 4 is a selectably fusible link 32 comprised generally of programmable link 10 and a select transistor 33. Select transistor 33 has a drain connected to source 18 of transistor 12, a source connected to a negative power supply terminal $V_{SS}$, for receiving current, for example ground, and a control gate for receiving a select signal S. Control gate 17, control gate 22, and drain 19 are connected to a programming voltage terminal $V_{PP}$ for receiving a high voltage, for example 15 volts. To select link 32 to provide an open circuit between drain 13 and source 14, signal S is applied to turn on transistor 33. Transistor 33 has a relatively large gain so that there is only a small voltage drop from its drain to source. Most of the voltage drop from $V_{PP}$ to $V_{SS}$ is across transistor 12. Consequently, there are hot electrons flowing through transistor 12 which are pulled to floating gate 23 at portion 26 (see FIG. 1) by the high voltage on control gates 22 and 17. Transistor 11 is then in the programmed state so that it has a higher threshold voltage to prevent it from turning on even when the 5.0 volts of normal operation is present at control gate 17. When a current path between drain 13 and source 14 is desired, select signal S is not applied so that transistor 33 does not turn on which prevents current from flowing through transistor 12. With no current flowing through transistor 12, there are not any hot electrons available to be pulled to floating gate 23. Consequently, transistor 11 will remain in an unprogrammed state so that the threshold voltage remains sufficiently low to allow it to turn on. A selectively interruptable current path is thereby created between drain 13 and source 14 which serve as output terminals. Circuitry involved in implementing redundancy is connected to this selectively interruptable current path. Although a high voltage may be required for selecting between an open or short circuit between drain 13 and source 14, this high voltage is not applied to drain 13 or source 14. Consequently the circuitry which is involved in implementing redundancy need not be subjected to this high voltage, an improvement over the prior art.

Other variations are possible. If transistor 11 is a depletion transistor, a transistor with a negative threshold voltage, a current path will be present between drain 13 and source 14 in the absence of an applied voltage to control gate 17. In the programmed state the threshold is brought to a positive level so that in the absence of an applied voltage to control gate 17 there will not be a current path between drain 13 and source 14. Control gate 17 can thus be eliminated. There is also currently available thin oxide processes so that the oxide shown in FIG. 2 between second portion 26 of floating gate 23 and channel region 21 is very thin, for example 150 Angstroms, which allows Fowler-Nordheim tunneling for programming in place of using hot electrons.

Shown in FIG. 5 is a selectably fusible link 34 comprised of a link transistor 36, a programming transistor 37, a load transistor 38, and a select transistor 39. Transistor 36 is analogous to transistor 11 of FIG. 4 but is a depletion transistor and does not have a control gate. Transistor 37 is analogous to transistor 12 but is connected in a capacitor configuration. A floating gate 41 is analogous to floating gate 23 but has only thin oxide between it and the channel of transistor 37. Transistor 37 has a control gate connected to $V_{PP}$, and a source and a drain connected together. Transistor 38 is a depletion transistor which acts as a resistive load element having a drain connected to $V_{PP}$, and a gate and a source connected to the drain and source of transistor 37. Transistor 39 has a drain connected to the gate and source of transistor 38 and the source and drain of transistor 37, a control gate for receiving select signal S, and a source connected to $V_{SS}$. To program transistor 36, signal S is applied to the control gate of transistor 39 to turn transistor 39 on to pull the source and drain of transistor 37 to essentially $V_{SS}$. With a high voltage applied to the control gate of transistor 37, electrons tunnel from the source and drain of transistor 37 to floating gate 41 which has the effect of increasing the threshold voltage of transistor 36 to a positive voltage. With no means to apply a control gate voltage to transistor 36, transistor 36 will consequently turn off, stopping the drain to source current path of transistor 36. When transistor 36 is to remain unprogrammed to maintain a drain to source current path, signal S is not applied so that transistor 39 does not turn on. With transistor 39 off the high voltage from $V_{PP}$ is coupled through load transistor 38 to the source and drain of transistor 37. Consequently there is no voltage differential between the control gate and the source and drain of transistor 37 to cause electrons to tunnel to floating gate 41. Transistor 36 remains unprogrammed so that it maintains a drain to source current path. The drain and source of transistor 36 thus form a selectively interruptable current path useful for implementing redundancy. Capacitance between the control gate of transistor 37 and floating gate 41 is made relatively large, by conventional means, so that most of the high voltage from $V_{PP}$ will be dropped between floating gate 41 and the source and drain of transistor 37 when signal S is applied instead of being dropped between the control gate of transistor 37 and floating gate 41.

Shown in FIG. 6 is fusible link 42 constructed in accordance with the description of FIGS. 1-5. Fusible link 42 has a terminal P for receiving a high voltage, a terminal S for receiving a logic signal, a terminal G for coupling to a negative power supply terminal such as ground, and terminals T1 and T2 for selectively providing a current path therebetween. A current path is provided between terminals T1 and T2 unless fusible link 42 is programmed. With terminal G connected to ground, fusible link 42 is programmed with the contemporaneous presence of a high voltage on terminal P and a logic high on terminal S. When fusible link 42 is programmed, there is effectively an open circuit between terminals T1 and T2. Fusible links hereinafter described function in the same way as that described for fusible link 42.

Shown in FIG. 7 is a circuit 43 for disabling a defective line of memory cells 44 comprised of a NOR decoder 46 and a disabling circuit 47. NOR decoder 46 comprises a load transistor 48 and a plurality of address transistors 49, 50 and 51. Load transistor, 48 is a depletion transistor having a gate and a source connected to a conductor line 52, and a drain connected to a positive power supply terminal $V_{DD}$ for receiving a positive power supply voltage such as 5.0 volts. Address transistors 49-51 each have a drain connected to conductor line 52 and a source connected to ground. Transistor 49 has a gate for receiving an address signal $A_O$ or $\overline{A_O}$, transistor 50 has a gate for receiving an address signal $A_1$ or $\overline{A_1}$, and transistor 51 has a gate for receiving address signal $A_L$ or $\overline{A_L}$. Only three address transistors 49-51 are shown for convenience. In a typical memory there will be an address transistor for each address bit. Address signal $A_L$ is indicative of the address signal with the largest numbered subscript. Disabling circuit 47 comprises a fusible link 53, a load transistor 54, a transistor 56, and a transistor 57. Fusible link 53 has a terminal P connected to $V_{PP}$, a terminal S connected to conductor line 52, a terminal G connected to ground, a terminal T2 connected to ground, and a terminal T1. Load transistor 54 is a depletion transistor having a drain connected to $V_{DD}$, and a gate and a source connected to terminal T1 of fusible link 53. Transistor 57 has a gate connected to terminal T1 of fusible link 53, a drain connected to conductor line 52, and a source. Transistor 56 has a drain connected to the source of transistor 57, a source connected to ground, and a gate for receiving a complementary repair signal $\overline{R}$.

NOR decoder 46 is a typical row decoder in MOS technology memories. For each row in the memory there is a NOR decoder which has a unique connection to true and complementary address signals $A_o$–$A_L$. When a particular row is selected by the address, the NOR decoder provides a logic high to the row. In order for line of memory cells 44 to be selected, address transistors 49-51 must all be turned off. This is achieved by all of the address signals received by the gates of transistors 49-51 being at a logic low, i.e., the particular combination of true and complementary address signals $A_o$–$A_L$ which selects line of memory cells 44 must all be logic low. Upon a determination, during a probe stage of testing, that line of memory cells 44 is defective, it is then necessary to disable line of memory cells 44 from ever being selected during normal operation. This is achieved by disable circuit 47 which, when programmed, couples conductor line 52 to ground, preventing conductor line 52 from providing a logic high even when the address for selecting line of memory cells 44 is present. Prior to providing a disable function, disable circuit 47 does not effect the operation of NOR decoder 46 selecting line of memory cells 44. With terminals T1 and T2 of fusible link 53 providing a current path to ground, transistor 57 is held off.

In order to disable line of memory cells 44 from being selected, fusible link 53 is programmed to provide an open circuit between terminals T1 and T2 of fusible link 53. Load transistor 54 then couples the 5.0 volts on $V_{DD}$ to the gate of transistor 57, turning transistor 57 on. In normal operation, complementary repair signal $\overline{R}$ is a logic high so that transistor 56 is turned on. With transistors 57 and 56 turned on, conductor line 52 is held to ground, preventing line of memory cells 44 from being selected. Fusible link 53 is programmed by applying the address for line of memory cells 44 so that conductor line 52 becomes a logic high via transistor 48. With terminal S of fusible link 53 consequently held at a logic high, a high voltage is then applied at $V_{PP}$ which thus causes fusible link 53 to be programmed. During this programming, complementary repair signal e,ovs/R/ is held at a logic low to turn transistor 56 off. Transistor 56 is present to ensure that fusible link 53 can be properly programmed. As fusible link 53 is being programmed, transistor 57 begins turning on. If the source of transistor 57 were coupled to ground, as during normal operation, the logic high required at terminal S of fusible link 53 would tend to degrade as transistor 57 turns on. The degradation of signal strength on terminal S of fusible link 53 could have an adverse effect on the programming thereof. Complementary repair signal $\overline{R}$ may be present as part of a normal test procedure or can easily be generated from the high voltage signal applied at $V_{PP}$.

Shown in FIG. 8 is a circuit 58 for implementing a redundant line of memory cells 59 comprised of a NOR decoder 61 and a plurality of fusible links 62. NOR decoder 61 is comprised of address transistors 63, 64, 65 and 66, and a load transistor 67. Plurality of fusible links 62 is comprised of fusible links 68, 69, 70 and 71. Load transistor 67 is a depletion transistor having a drain connected to $V_{DD}$, and a source and a gate connected to a conductor line 72. Transistor 63 has a gate for receiving address signal $A_o$, a drain connected to conductor line 72, and a source. Transistor 64 has a gate for receiving address signal $\overline{A}_o$, a drain connected to conductor line 72, and a source. Fusible link 68 has terminal P connected to $V_{PP}$, a terminal S connected to the gate of transistor 63, a terminal G connected to ground, a terminal T1 connected to the source of transistor 63, and a terminal T2 connected to ground. Fusible link 69 has a terminal P connected to $V_{PP}$, a terminal S connected to the gate of transistor 64, a terminal G connected to ground, a terminal T1 connected to the source of transistor 64, and a terminal T2 connected to ground. Transistors 63 and 64 and fusible links 68 and 69 as interconnected comprise a bit implementation circuit 73.

Transistor 65 has a gate for receiving address signal $A_L$, a drain connected to conductor line 72, and a source. Transistor 66 has a gate for receiving address signal $\overline{A}_L$, a drain connected to conductor line 72, and a source. Fusible link 70 has a terminal P connected to $V_{PP}$, a terminal S connected to the gate of transistor 65, a terminal G connected to ground, a terminal T1 connected to the source of transistor 65, and a terminal T2 connected to ground. Fusible link 71 has a terminal P connected to $V_{PP}$, a terminal S connected to the gate of transistor 66, a terminal G connected to ground, a terminal T1 connected to the source of transistor 66, and a terminal T2 connected to ground. Transistors 65 and 66 and fusible links 70 and 71 as interconnected comprise a bit implementation circuit 74. For convenience, only bit implementation circuits 73 and 74 are shown. In a memory there will be a bit implementation circuit for each bit. As shown in FIG. 8, for the first address bit, bit implementation circuit 73 receives both true address signal $A_o$ and complementary address signal $\overline{A}_o$. For the last address bit implementation circuit 74 receives both true and complementary addresses $A_L$ and $\overline{A}_L$.

A typical NOR decoder has one address transistor for each address bit for receiving one of the true or complementary address signals for the corresponding address bit. As shown in FIG. 8, NOR decoder 61 has two address transistors for each address bit. Transistors 63 and 64 are for the first address bit. Transistors 65 and 66 are for the last address bit. For convenience the address transistors for the intervening bits are not shown. With the pair of address transistors 63 and 64 for the first address bit, transistor 63 for receiving true address signal $A_o$ and transistor 64 for receiving complementary address $\overline{A}_o$, one of transistors 63 and 64 will be turned on. Each bit has a corresponding pair of address transistors for receiving both the true and complementary address signal associated with that bit. With fusible links 62 interposed between address transistors 63–66 and ground, address transistors can be selectively disabled. With fusible links 68–71 in the unprogrammed state, the sources of transistors 63–66 are coupled to ground. Consequently conductor line 72 is ensured of being held at ground so that line of memory cells 59 cannot be enabled. In the event that there are no defective lines of memory cells in the particular memory under test, fusible links 68–71 will not be programmed with the result that conductor line 72 will always be inhibited from supplying a logic high to line of memory cells 59.

In the event there is a defective line of memory cells with a consequent desire to replace the defective line with redundant line of memory cells 59, fusible links 68–71 are selectively programmed so that circuit 58 responds to the address of the defective line to provide a logic high on conductor line 72 to enable line of memory cells 59. This is achieved by applying the address of the defective line and then applying a high voltage on $V_{PP}$. Using bit implementation circuit 73 for explanation, assume that for the first bit, the defective line receives signal $A_o$ on its NOR decoder. Consequently signal $A_o$ at a logic low should result in no current path to ground through transistor 63 or 64. Likewise, signal $A_o$ at a logic high should result in a current path to ground through transistor 63 or 64. This is achieved by programming fusible link 69 to disable address transistor 64 from effecting conductor line 72. Applying the address of the defective line, in this example, means that signal $A_o$ is at a logic low and signal $\overline{A}_o$ is at a logic high. With terminal S of fusible link 69 at a logic high, a high voltage is applied at $V_{PP}$ causing fusible link 69 to be programmed to provide an open circuit between the source of transistor 64 and ground. Fusible link 68 is not programmed upon the application of the high voltage because terminal S of fusible link 68 was held at a logic low by signal $A_o$. The high voltage should be removed prior to changing the address to avoid programming both fusible links associated with a single bit. The other bit implementation circuits are programmed in the same way at the same time. The address of the defective line is applied and then the high voltage is applied to disable each address transistor corresponding to the complement of the address of the defective line. The high voltage acts as an implementation signal because upon the application thereof circuit 58 is implemented for the purpose of enabling line of memory cells 59 in response to the address of the defective line.

Circuit 43 of FIG. 7 is also disabled in response to receiving the particular address of line of memory cells 44 and the application of the high voltage to $V_{PP}$. Accordingly defective line of memory cells 44 is replaced by redundant line of memory cells 59 simply by applying the address of defective line of memory cells 44 and the high voltage to $V_{PP}$. More than one redundant line of memory cells can be effectively implemented simply by providing a separate $V_{PP}$ terminal for each redundant line of memory cells. In which case only the redundant line of memory cells associated with the particular $V_{PP}$ terminal receiving the high voltage will be implemented.

While the invention has been described in a preferred embodiment, it will be apparent to those skilled in the art that the disclosed invention may be modified in numerous ways and may assume many embodiments other than that specifically set out and described above. For example, another alternative for disabling a defective line of memory cells is to interpose a fusible link between the conductor line of the decoder and the line of memory cells. Accordingly, it is intended by the appended claims to cover all modifications of the invention which fall within the true spirit and scope of the invention.

I claim:

1. A circuit for replacing a defective line of memory cells with a redundant line of memory cells, comprising:
    a first NOR decoder comprised of IGFETS having an output for providing an enable signal to the defective line memory cells in response to a predetermined combination of true and complementary address signals;
    disabling means, coupled to the output of the first NOR decoder, for disabling the defective line of memory cells, in response to contemporaneously receiving an implementation signal and the enable signal, by preventing the subsequent occurrence of the enable signal;

a second NOR decoder, coupled to the redundant line of memory cells, comprised of IGFETs, and having inputs for the true and for the complementary address signals; and a plurality of fusible links for disabling all of the inputs which are for the true and complementary address signals which are complementary to the predetermined combination in response to the contemporaneous occurrence of the predetermined combination and the implementation signal;

whereby the second NOR decoder provides an output signal to the redundant line of memory cells in response to receiving the predetermined combination if the inputs of the second NOR decoder which are for the true and complementary address signals which are complementary to the predetermined combination have been disabled.

2. The circuit of claim 1 wherein the disabling means comprises a first floating gate fusible link which provides an open circuit between first and second terminals in response to receiving the enable signal of the first NOR decoder and the implementation signal.

3. The circuit of claim 2 wherein the disabling means further comprises:

a resistive load coupled between a first power supply terminal and the first terminal of the first floating gate fusible link; and a disabling transistor having a first current electrode coupled to the output of the first NOR decoder, a second current electrode coupled to a second power supply terminal, and a control electrode coupled to the first terminal of the floating gate fusible link.

4. The circuit of claim 3 further comprising an interrupt transistor interposed between the second current electrode of the disabling transistor and the second power supply terminal, wherein said interrupt transistor has a first current electrode coupled to the second current electrode of the disabling transistor, a second current electrode coupled to the second power supply terminal, and a control electrode for receiving a repair signal.

5. A circuit for replacing a defective line of memory cells with a redundant line of memory cells, comprising:

a NOR decoder having an output for providing an enable signal to the defective line of memory cells in response to a predetermined combination of true and complementary address signals;

disabling means, coupled to the output of the NOR decoder, for disabling the defective line of memory cells, in response to contemporaneously receiving an implementation signal and the enable signal, by preventing the subsequent occurrence of the enable signal; and a plurality of bit implementation circuits coupled to the redundant line of storage cells having inputs for receiving the true and complementary address signals representative of bits of an address, each bit implementation circuit being associated with a particular bit;

wherein each bit implementation circuit has a pair of inputs, one for receiving the true address signal and one for receiving the complementary address signal, which are representative of the particular associated bit, and implementation means for disabling the input which is for receiving the address signal which is complementary to the address signal received upon contemporaneous application of the predetermined combination and the implementation signal; and wherein the plurality of bit implementation circuits provide an output signal to the redundant line of memory cells in response to receiving the predetermined combination if the inputs of bit implementation circuits which are for address signals complementary to the predetermined combination have been disabled.

6. The circuit of claim 5 wherein each implementation circuit comprises:

a true address transistor having a first current electrode coupled to an output node for providing the output signal, a control electrode for receiving the true address signal of the particular bit associated with the implementation circuit, and a second current electrode;

a complementary address transistor having a first current electrode coupled to the output node, a control electrode for receiving the complementary address signal of the particular bit associated with the implementation circuit, and a second current electrode;

a first floating gate fusible link having a first input coupled to the control electrode of the true address transistor, a second input for receiving the implementation signal, a first output terminal coupled to the second current electrode of the true address transistor, and a second output terminal coupled to a first power supply terminal, wherein a current path is provided between the first and second output terminals until the implementation signal and the true address signal are contemporaneously received; and a second floating gate fusible link having a first input coupled to the control electrode of the complementary address transistor, a second input for receiving the implementation signal, a first output terminal coupled to the second current electrode of the complementary address transistor, and a second output terminal coupled to the first power supply terminal, wherein a current path is provided between the first and second output terminals until the implementation signal and the complementary address signal are contemporaneously received.

* * * * *